United States Patent
Jagtap

(10) Patent No.: US 10,199,103 B2
(45) Date of Patent: Feb. 5, 2019

(54) METHOD FOR IMPLEMENTING MEMRISTIVE LOGIC GATES

(71) Applicant: Anubhav Jayraj Jagtap, Long Beach, CA (US)

(72) Inventor: Anubhav Jayraj Jagtap, Long Beach, CA (US)

( * ) Notice: Subject to any disclaimer, the term of this patent is extended or adjusted under 35 U.S.C. 154(b) by 0 days.

(21) Appl. No.: 15/603,370

(22) Filed: May 23, 2017

(65) Prior Publication Data

US 2017/0337968 A1 Nov. 23, 2017

Related U.S. Application Data

(60) Provisional application No. 62/339,964, filed on May 23, 2016.

(51) Int. Cl.
*G11C 13/00* (2006.01)
*H03K 19/20* (2006.01)
*H01L 45/00* (2006.01)

(52) U.S. Cl.
CPC ........ *G11C 13/0097* (2013.01); *G11C 13/004* (2013.01); *H03K 19/20* (2013.01); *H01L 45/04* (2013.01); *H01L 45/1233* (2013.01); *H01L 45/146* (2013.01)

(58) Field of Classification Search
CPC .............. G11C 13/0097; G11C 13/004; H01L 45/1233; H01L 45/146; H03K 19/20

USPC .................................................. 326/104, 135
See application file for complete search history.

(56) References Cited

U.S. PATENT DOCUMENTS

| | | | | |
|---|---|---|---|---|
| 8,861,253 B2* | 10/2014 | Chang | ................. | G11C 11/5685 365/148 |
| 2012/0212255 A1* | 8/2012 | Jeong | ................. | G11C 11/5678 326/38 |
| 2012/0280196 A1* | 11/2012 | Yang | .................... | H01L 45/1608 257/1 |
| 2013/0307662 A1* | 11/2013 | Yang | ...................... | H01C 7/041 338/20 |
| 2015/0123703 A1* | 5/2015 | Dediu | ..................... | H01L 43/08 326/38 |
| 2015/0256178 A1* | 9/2015 | Kvatinsky | ........ | H03K 19/00346 326/31 |

* cited by examiner

*Primary Examiner* — Daniel D Chang
(74) *Attorney, Agent, or Firm* — MU P.C.

(57) ABSTRACT

An embodiment of the present invention provides a method for implementing Boolean functionality to create AND, OR, NAND, NOR, or NOT logic gates using a single memristor. In an embodiment, a first voltage is applied to the memristor within a predetermined range of one of the prescribed Boolean functions to be performed by the memristor. A second voltage is then applied within the predetermined range of the prescribed Boolean function. The memristor then provides an output based on the Boolean function that has been prescribed. In an embodiment, the resistance value of the memristor is then reset by a reset pulse, wherein the reset pulse is another applied voltage.

7 Claims, 12 Drawing Sheets

| Truth table for AND gate | | |
|---|---|---|
| INPUT 1 | INPUT 2 | OUTPUT = (INPUT 1 * INPUT 2) |
| 0 | 0 | 0 |
| 0 | 1 | 0 |
| 1 | 0 | 0 |
| 1 | 1 | 1 |

FIG. 11B

| Truth table for OR gate | | |
|---|---|---|
| INPUT 1 | INPUT 2 | OUTPUT = (INPUT 1 + INPUT 2) |
| 0 | 0 | 0 |
| 0 | 1 | 1 |
| 1 | 0 | 1 |
| 1 | 1 | 1 |

FIG. 11C

| Truth table for NAND gate | | |
|---|---|---|
| INPUT 1 | INPUT 2 | OUTPUT = (INPUT 1 * INPUT 2)' |
| 0 | 0 | 1 |
| 0 | 1 | 1 |
| 1 | 0 | 1 |
| 1 | 1 | 0 |

FIG. 11D

| Truth table for NOR gate | | |
|---|---|---|
| INPUT 1 | INPUT 2 | OUTPUT = (INPUT 1 + INPUT 2)' |
| 0 | 0 | 1 |
| 0 | 1 | 0 |
| 1 | 0 | 0 |
| 1 | 1 | 0 |

FIG. 11E

| Truth table for NOT gate | |
|---|---|
| INPUT | OUTPUT |
| 0 | 1 |
| 1 | 0 |

METHOD FOR IMPLEMENTING MEMRISTIVE LOGIC GATES

CROSS-REFERENCE TO RELATED APPLICATION(S)

The present application claims priority to U.S. Provisional Patent Application No. 62/339,964 filed on May 23, 2016, entitled "Implementing Logic Gates Using Single Memristor" the entire disclosure of which is incorporated by reference herein.

BACKGROUND OF THE INVENTION

Description of Related Art

Moore's law is at its frontier to further increase transistor number on square cm of a chip. The memristor, claimed to be a fourth fundamental electronic component, is the best solution for continuing the trend for more computation on smaller chip area.

Memristor was proposed in 1971 by Leon Chua. He proved that behavior of the memristor could not be replicated by any other circuit built using the three fundamental circuit elements namely resistor, inductor and capacitor, so there must be a fourth fundamental component, namely the memristor. According to his theory, the basic relationship in passive circuits is not only between voltage and charge, but also between changes-in-voltage or flux and charge.

The first memristor was fabricated by HP labs in 2008. According to them, if memristors were combined with transistors in a hybrid chip, the performance of digital circuits could be improved even without shrinking transistors. So, Moore's Law can be sustained without changing the expensive and progressively challenging method of placing twice as much transistor density on chips for another decade.

Based on the foregoing, there is a need in the art for a method to implement Boolean logic gates using a memristor. What might be further desired is a method to use a single memristor to define AND, OR, NAND, NOR, and NOT logic gates.

SUMMARY OF THE INVENTION

In an embodiment, the present invention is a method of implementing Boolean functionality at a logic gate using a single memristor. The memristor is configured to be capable of producing an output corresponding to an input which determines the functionality of the gate.

In an embodiment, a first voltage is applied to the memristor within a predetermined range of one of the prescribed Boolean functions to be performed by the memristor. A second voltage is then applied within the predetermined range of the prescribed Boolean function. The memristor then provides an output based on the Boolean function that has been prescribed.

In an embodiment, the resistance value of the memristor is then reset by a reset pulse, wherein the reset pulse is another applied voltage.

The foregoing, and other features and advantages of the invention, will be apparent from the following, more particular description of the preferred embodiments of the invention, the accompanying drawings, and the claims.

BRIEF DESCRIPTION OF THE DRAWINGS

For a more complete understanding of the present invention, the objects and advantages thereof, reference is now made to the ensuing descriptions taken in connection with the accompanying drawings briefly described as follows.

FIG. 11A is a truth table for the memristive AND gate, according to an embodiment of the present invention;

FIG. 11B is a truth table for the memristive OR gate, according to an embodiment of the present invention;

FIG. 11C is a truth table for the memristive NAND gate, according to an embodiment of the present invention;

FIG. 11D is a truth table for the memristive NOR gate, according to an embodiment of the present invention;

FIG. 11E is a truth table for the memristive AND gate, according to an embodiment of the present invention.

DETAILED DESCRIPTION OF PREFERRED EMBODIMENTS

Figure 1:
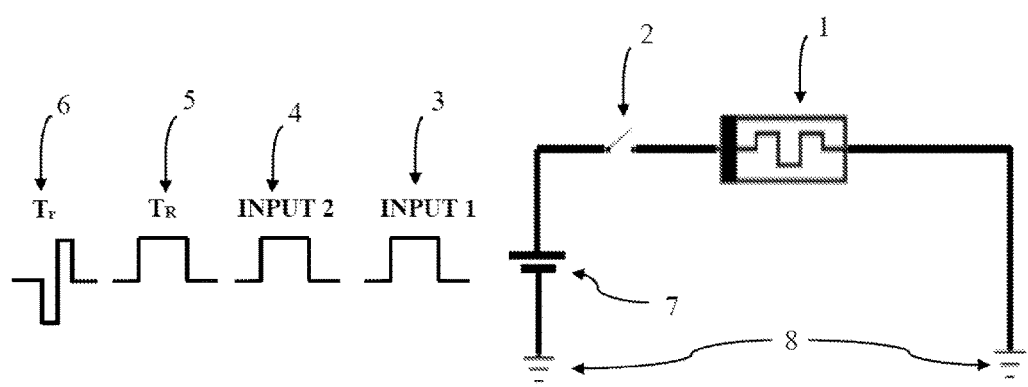
FIG. 1 is a circuit diagram of the memristive logic gate, according to an embodiment of the present invention.

Preferred embodiments of the present invention and their advantages may be understood by referring to FIGS. 1-12, wherein like reference numerals refer to like elements.

The logic family described in this invention has the memristive logic gates, which is based on the concept of multivalued storage of the memristor, along with the Q-point (quiescent-point) theory of metal-oxide-semiconductor field-effect transistor (MOSFET). The inputs for both the logic states, that is, for logic 0 and for logic 1 are applied sequentially.

In an embodiment, the logic family has gates build with a single memristor for both the operations that is input and output. This logic family contains AND, OR, NAND, NOR and NOT logic gates. Each logic gate is operated by applying different voltages on a single memristor, and the corresponding output is obtained for each logic level. Due to this fact, the memristor is not initialized prior to the operation, but the memristor needs a reset pulse to reset it to its initial state before applying a different logic level. In this logic family, the logic values are stored as resistances.

When the first input of a specific amplitude $V_A$ and width $T_W$ is applied to the memristor, then the value of the input is stored inside the memristor in the form of its corresponding value of resistance, which is called memristance. When the second input of a specific amplitude $V_A$ and width $T_W$ is applied to the memristor, then the value of the memristance changes depending upon the applied input. The input is either logic 1 or logic 0.

A read voltage of time interval $T_r$ is applied across the memristor in order to determine the recent value of memristance, through which the output for memristive logic gate is obtained.

Hence, the write voltage pulses applied across the memristor determines the input and reset pulses for memristive logic gate. This new value of memristance determines the output of the logic gates and is unique for all different logic gates. This is in accordance with the I-V characteristics of the memristor.

FIG. 1 shows an embodiment of the circuit diagram for memristive logic gate. In this figure, 1 describes a memristor; 2 is the control switch that enables read or write operations of the memristor; 3, 4, 5 and 6 shows the applied sequence of INPUT1, INPUT2, $T_R$, and $T_r$ pulse respectively; 7 shows the source of input, write, reset, or read voltage for the memristor; and 8 is the ground terminal of the circuit. Here, INPUT1 and INPUT2 respectively are the first and second inputs for the memristive logic gate, $T_r$ is the read pulse applied to determine output of the memristor logic gate, and $T_R$ is the reset pulse required to reset the memristor. A reset pulse is required after a desired output is obtained, because the stored value of memristance needs to be cleared before the new inputs are applied to the memristor.

According to the Q-point theory of MOSFET, Q-point is a function of the gate voltage, the supply voltage and the load resistor. In order to obtain the desired drain current, MOSFET is biased in the saturation region. This drain current defines the MOSFET's Q-point. Based upon the applied gate voltage, the Q-point either moves up or down on the DC characteristic curve. In the similar way, when different voltages are applied across the memristor, a drastic change in its characteristic is seen. This change in the state of memristor is used to define different gates, depending upon the applied voltage across it.

Figure 2:
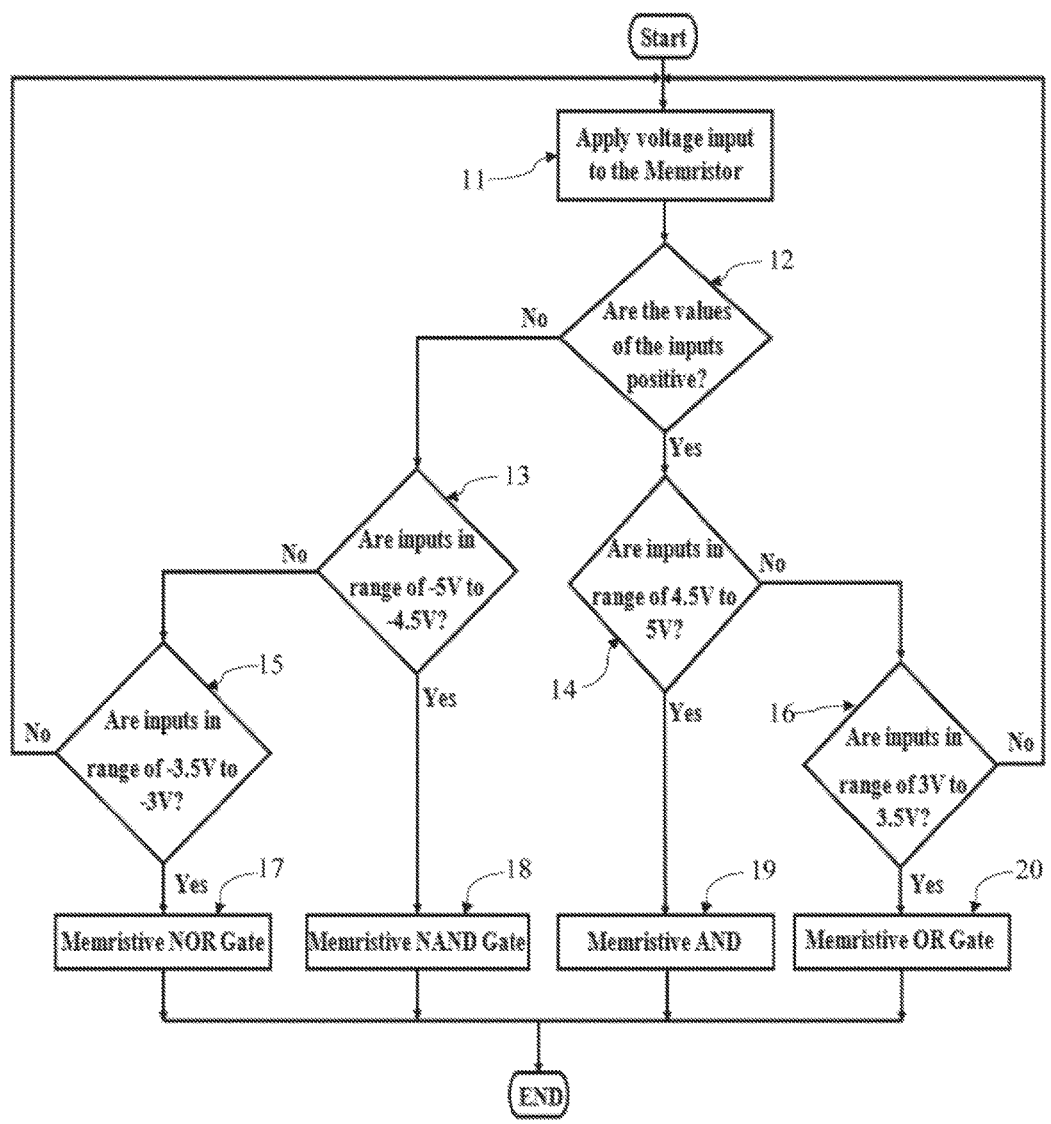
FIG. 2 is a flow chart of the memristive logic gate, according to an embodiment of the present invention.

In reference to FIG. 2, and embodiment of the invention is described by the flow chart for memristive logic gate. According to the flow chart, 11 describes the input voltage applied across the memristor; 12 describes whether the applied input value is positive or not; 13 describes whether the input value is in the range of −5V to −4.5V; 14 describes whether the input value is in the range of 4.5V to 5V; 15 describes whether the input value is in the range of −3.5V to −3V; 16 describes whether the input value is in the range of 3V to 3.5V; 17 is the memristive NOR gate if above criteria is satisfied; 18 is the memristive NAND gate if above criteria is satisfied; 19 is the memristive AND gate if above criteria is satisfied; and 20 is the memristive OR gate if above criteria is satisfied.

Figure 3:
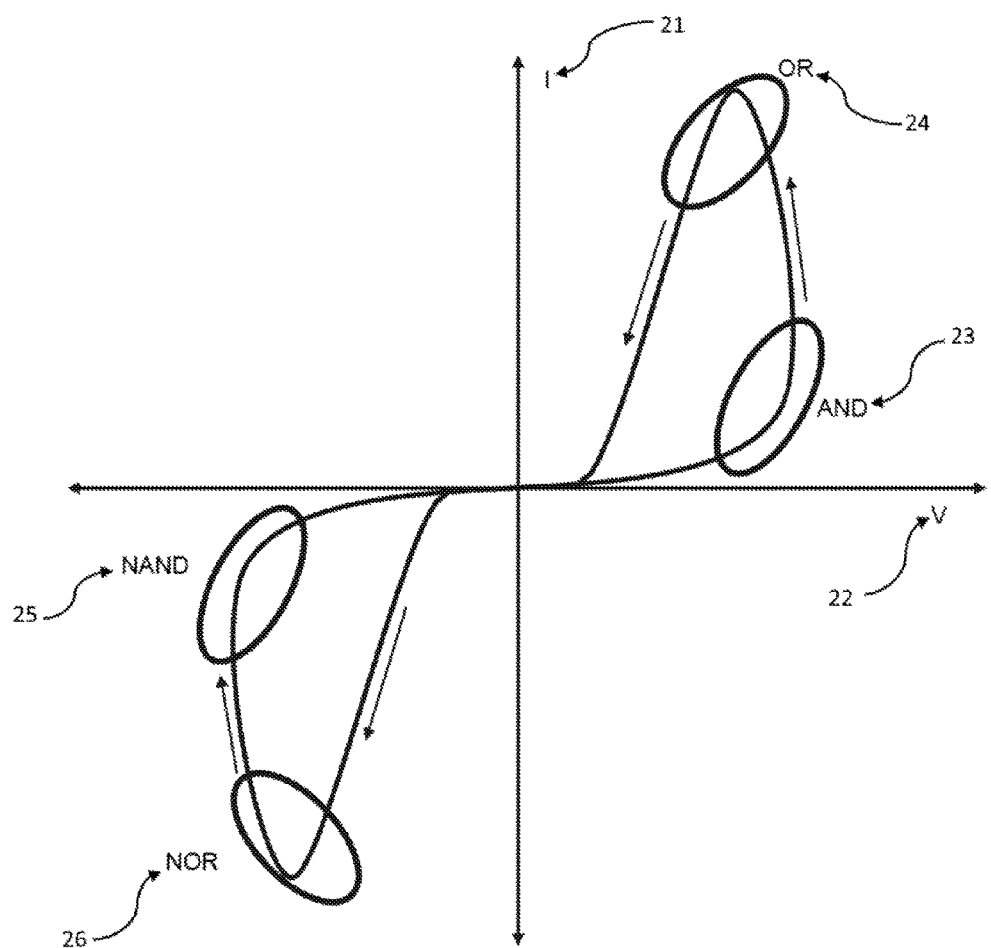
FIG. 3 is a graphical representation of the I-V characteristics of the memristor, according to an embodiment of the present invention.

In reference to FIG. 3, the voltage to define the logic value either 1 or 0, determines the behavior of memristor as a logic gate, when the memristor is placed in different regions of the Current (I)-Voltage (V) characteristics curve. Depending upon these different regions, different logic gates are defined. FIG. 3, shows the different logic gates on IV characteristics curve of the memristor. The voltage 22 and the current 21 across the memristor are plotted on the graph, and the resulting hysteresis loop is shown. When various voltages are applied as an input to the memristor, there is a unique trend which can be used to implement the logic gates.

For a memristor to behave as an AND gate 23, voltage level to define logic 1 is in the range of 4.5V to 5V and voltage level to define logic 0 is in the range of 1V to 1.5V.

Inversely, for NAND gate 25, voltage level to define logic 1 is in the range of −5V to −4.5V and voltage level to define logic 0 is in the range of −1.5V to −1V.

To describe OR gate 24, voltage level to define logic 1 is in the range of 3V to 3.5V and voltage level to define logic 0 is in the range of 1V to 1.5V.

Contrariwise, for NOR gate 26, voltage level to define logic 1 is in the range of −3.5V to −3V and voltage level to define logic 0 is in the range of −1.5V to −1V.

So, from these values of the voltages, it is clear that AND gate and OR gate are in the first quadrant of the IV characteristics curve and on the contrary NAND gate and NOR gate are in the third quadrant of the IV characteristics curve. Also, the value of applied voltages for OR gate and NOR gate are less than that of AND gate and NAND gate. In the embodiment, the applied current may be neglected as the logic functions are defined by voltage ranges on the hysteresis loop.

AND Gate: The proposed logic of the AND gate is based on memristive logic of a single memristor as described here. The operation of the gate is that, if both the inputs given to the memristor are high that is if both the inputs are at logic 1 state, then only the output is high that is logic 1. Moreover, for all the other combinations of the inputs, the output is low that is the output is logic 0. FIG. 11A shows the truth table of AND gate.

Figure 4:
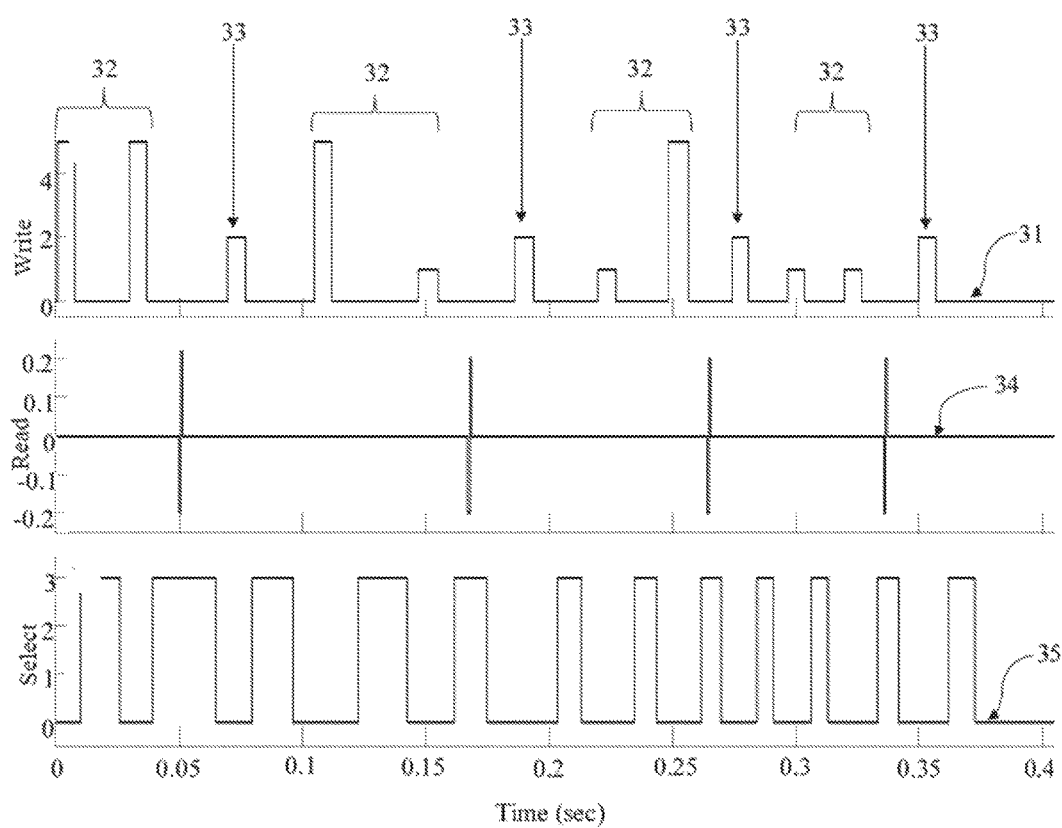
FIG. 4 is a sample of input signals for the memristive logic gate circuit, according to an embodiment of the present invention.

FIG. 4 shows the input for an embodiment of the memristive logic gates along with the read, write and select voltage pulses. In FIG. 4, 31 shows the applied sequence of input pulses along with the reset pulse, in the form of voltage pulses describing the write operation; 32 describes the two inputs applied to the memristive logic gate; 33 describes the reset pulse applied to reset the current state of the memristor; 34 shows the applied read pulses to verify the write operation, and 35 shows the select pulses to switch between read and write operation, this switch is the control switch (described as 2 in FIG. 1). Here, the select pulse is low (i.e. 0 V) for write operation only and else it is high (i.e. 3V).

Figure 5:
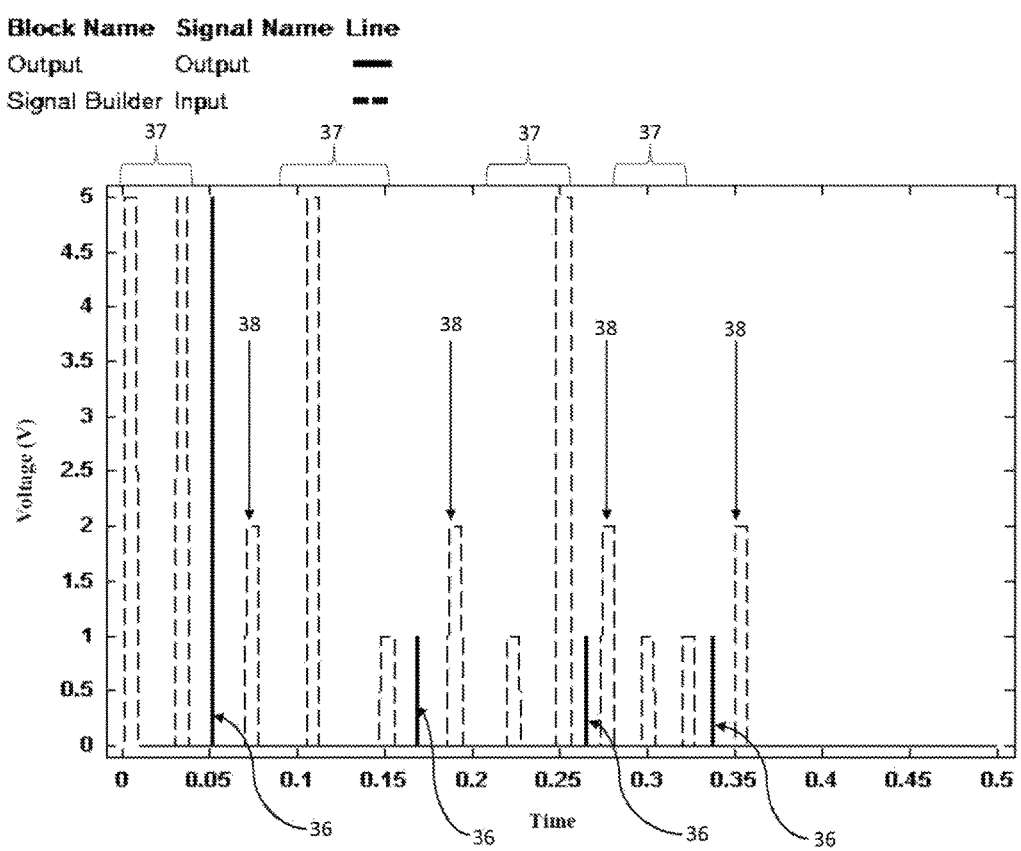
FIG. 5 is a graphical representation of the output of the memristive AND gate, according to an embodiment of the present invention.

FIG. 5 shows the output of the memristive logic AND Gate. In FIG. 5, 36 is the output for each sequence of applied inputs for memristive AND gate; 37 shows the applied inputs for memristive AND gate; 38 shows the reset pulse for memristive AND gate.

OR Gate: The proposed logic of the OR gate is based on memristive logic of a single memristor as described here. The operation of the gate is that, if both the inputs given to the memristor are low that is if both the inputs are at logic 0 state, then only the output is low that is logic 0. Moreover, for all the other combinations of the inputs, the output is high that is the output is logic 1.

Figure 6:
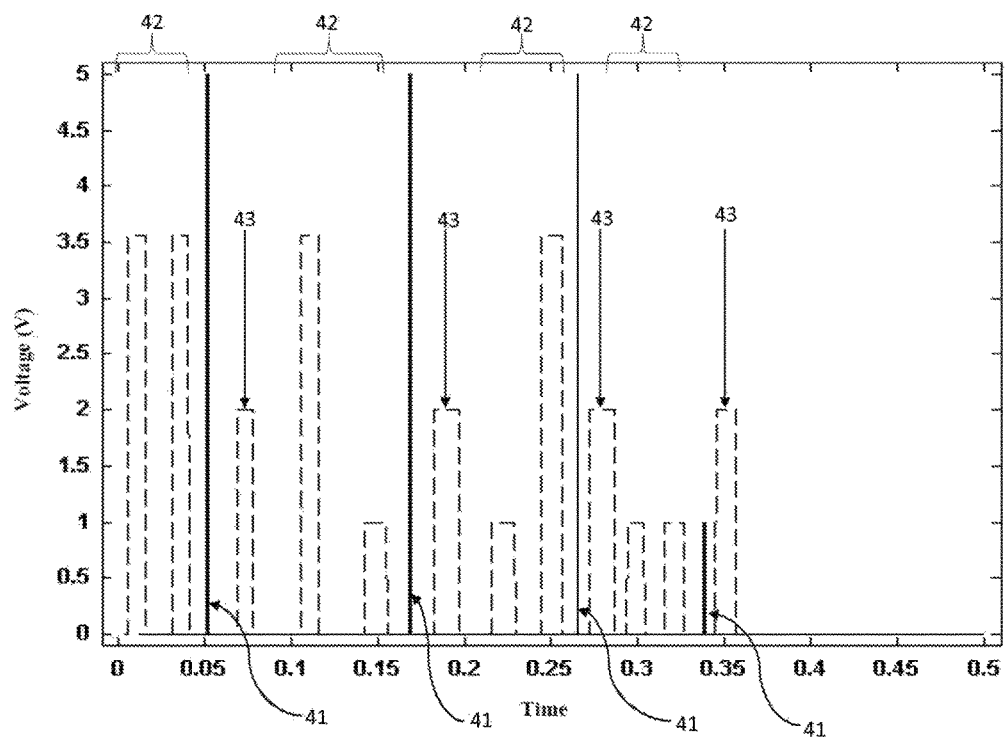
FIG. 6 is a graphical representation of the output of the memristive OR gate, according to an embodiment of the present invention.

FIG. 6 shows the output of the memristive logic OR Gate. In FIG. 6, 41 is the output for each sequence of applied inputs for memristive OR gate; 42 shows the applied inputs for memristive OR gate; 43 shows the reset pulse for memristive OR gate. FIG. 11B shows the truth table of OR gate.

NAND Gate: The proposed logic of the NAND gate is based on memristive logic of a single memristor as described here. The operation of the gate is that, if both the inputs given to the memristor are high, that is if both the inputs are at logic 1 state, then only the output is low, that is logic 0. Moreover, for all the other combinations of the inputs, the output is high that is the output is logic 1.

Figure 7:
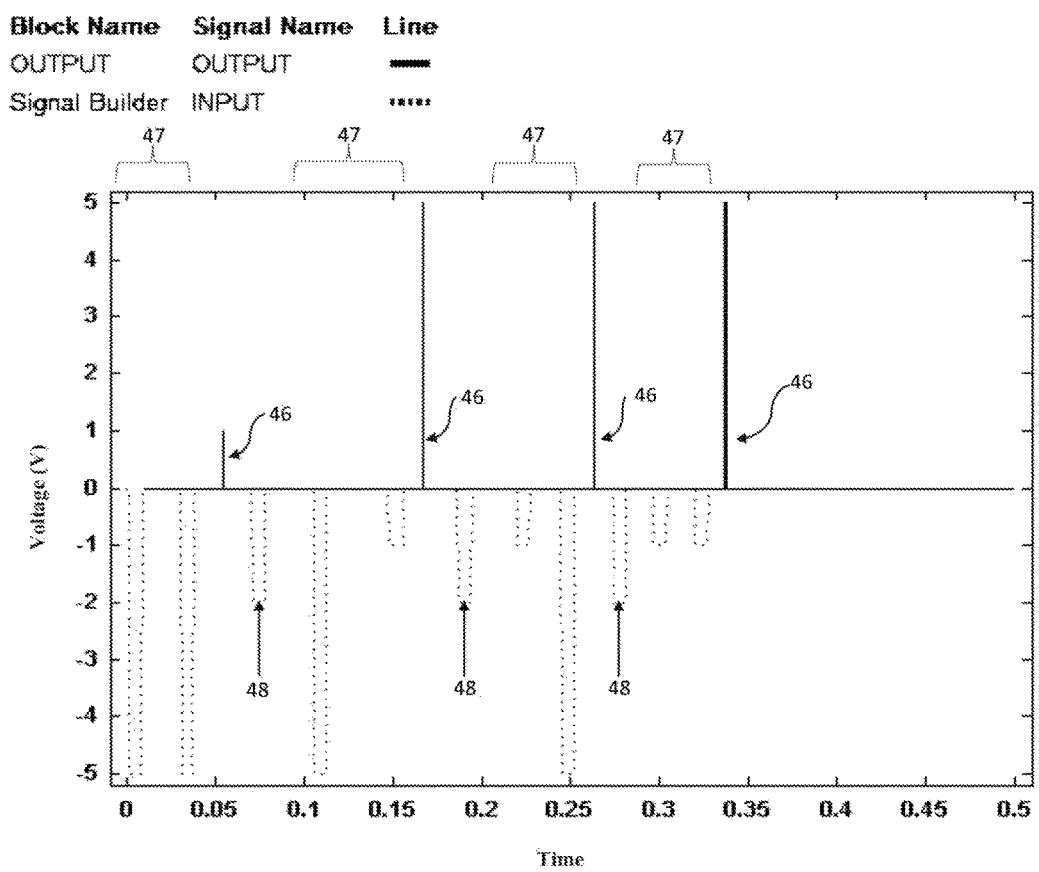
FIG. 7 is a graphical representation of the output of the memristive NAND gate, according to an embodiment of the present invention.

FIG. 7 shows the output of the memristive logic NAND Gate, according to an embodiment. In FIG. 7, 46 is the output for each sequence of applied inputs for memristive NAND gate; 47 shows the applied inputs for memristive NAND gate; 48 shows the reset pulse for memristive NAND gate. FIG. 11C shows the truth table of NAND gate.

NOR Gate: The proposed logic of the NOR gate is based on memristive logic of a single memristor as described here. The operation of the gate is that, if both the inputs given to the memristor are low, that is if both the inputs are at logic 0 state, then only the output is high, that is logic 1. Moreover, for all the other combinations of the inputs, the output is low that is the output is logic 0.

Figure 8:
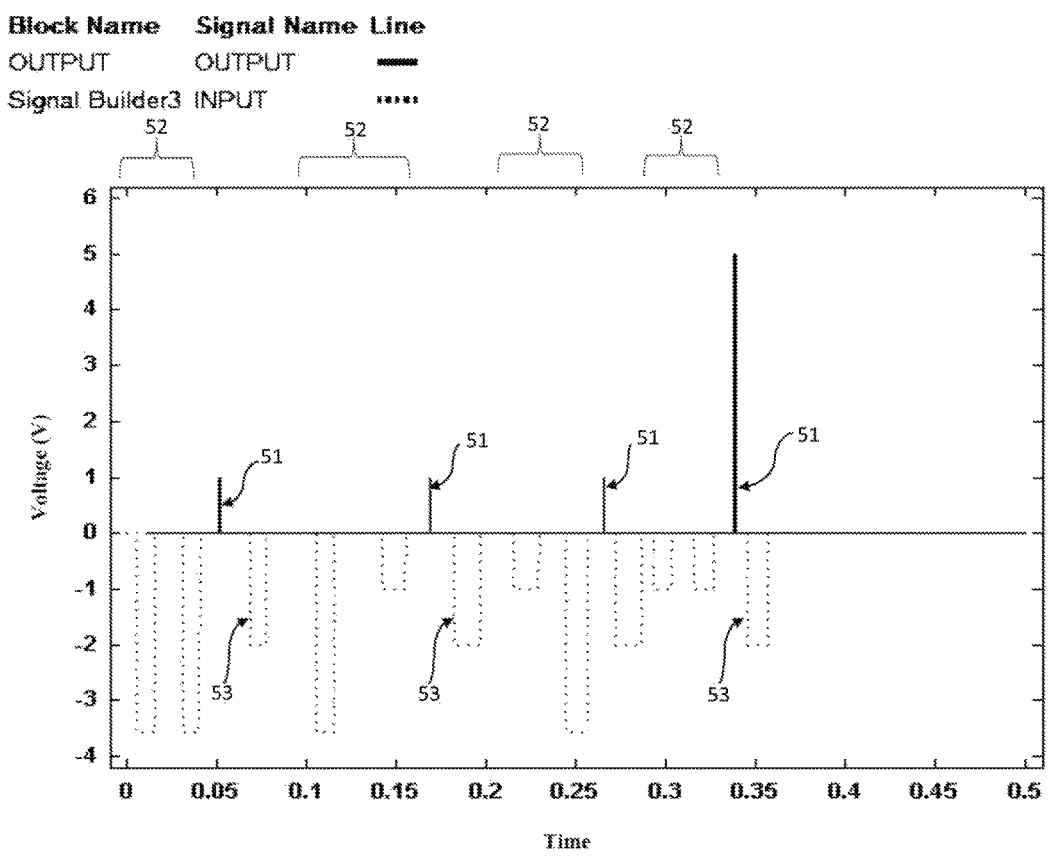
FIG. 8 is a graphical representation of the output of the memristive NOR gate, according to an embodiment of the present invention.

FIG. 8 shows the output of the memristive logic NOR Gate, according to an embodiment. In FIG. 8, 51 is the output for each sequence of applied inputs for memristive NOR gate; 52 shows the applied inputs (shown as dashed lines and as negative voltages) for memristive NOR gate; 53 shows the reset pulse for memristive NOR gate. FIG. 11D shows the truth table of the logic function.

NOT Gate: The proposed logic of the NOT gate is based on memristive logic of a single memristor as described here. The operation of the gate is that, if the input given to the memristor is low, that is if the input is logic 0, then only the output is high, that is logic 1 and vice versa.

Figure 9:
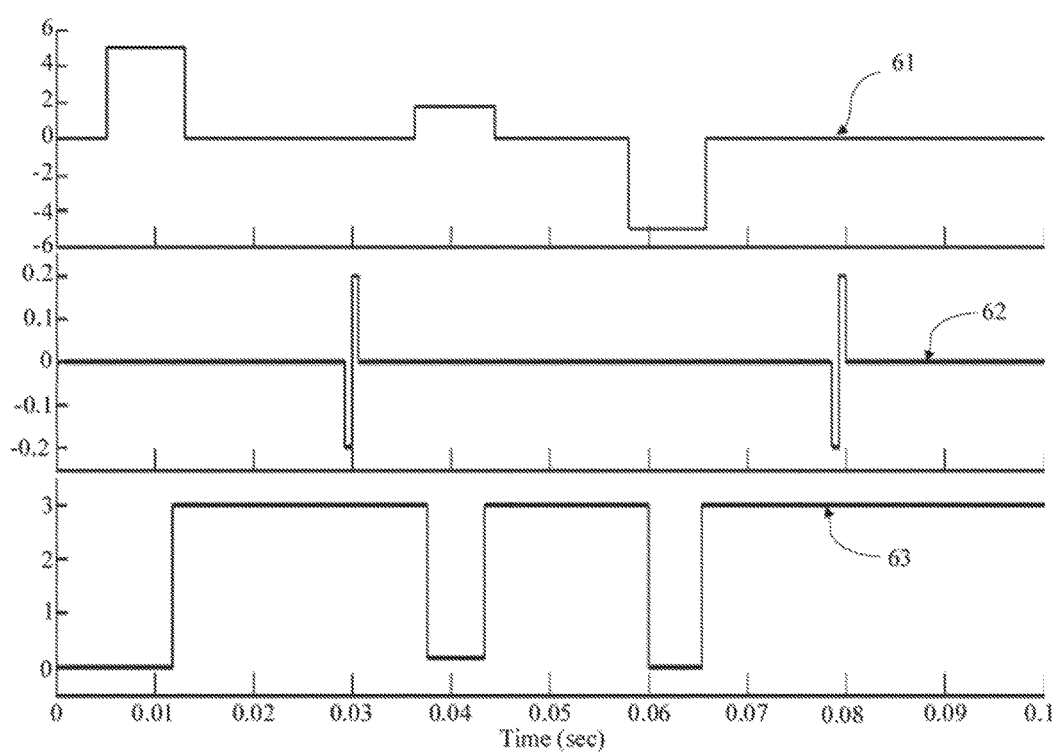
FIG. 9 is a sample of input signals for the memristive NOT, according to an embodiment of the present invention.

FIG. 9 shows the input signals for memristive logic NOT gate, where 61 shows the write pulse comprising of inputs and reset pulse for memristive NOT gate; 62 shows the applied read pulses to verify the write operation, and 63 shows the select pulses to switch between read and write operation, this switch is the control switch (depicted as 2 in FIG. 1). FIG. 11E shows the truth table of NOT gate.

Figure 10:
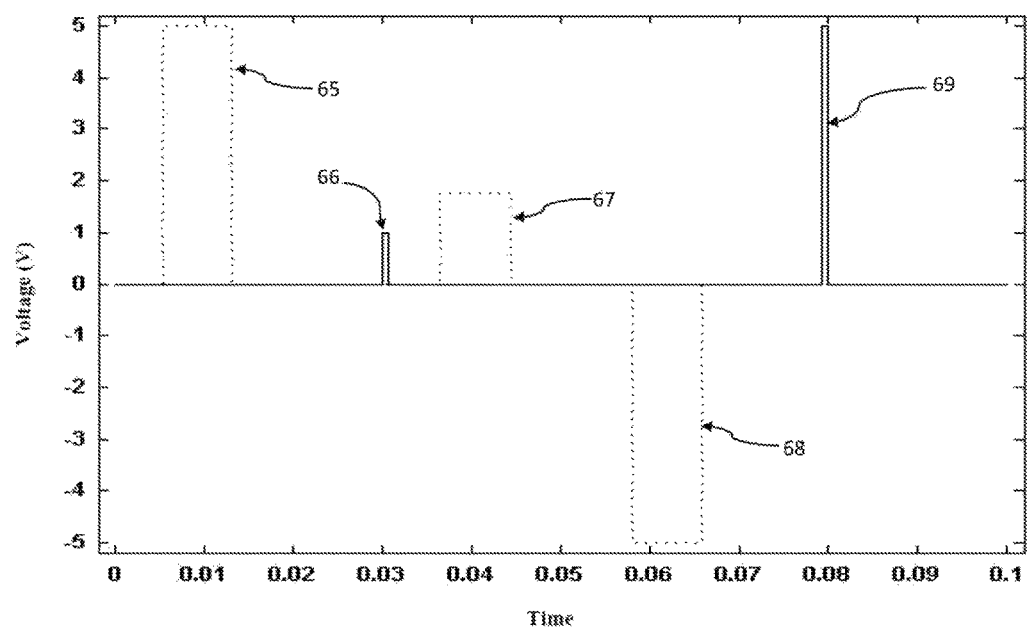
FIG. 10 is a graphical representation of the output of the memristive NOT gate, according to an embodiment of the present invention.

FIG. 10 shows the output of the memristive logic NOT Gate; here 65, 68 describes the input logic 1 and logic 0 respectively; 66, 69 describes the corresponding output for the given inputs; and 67 describes the reset pulse.

Figure 12:
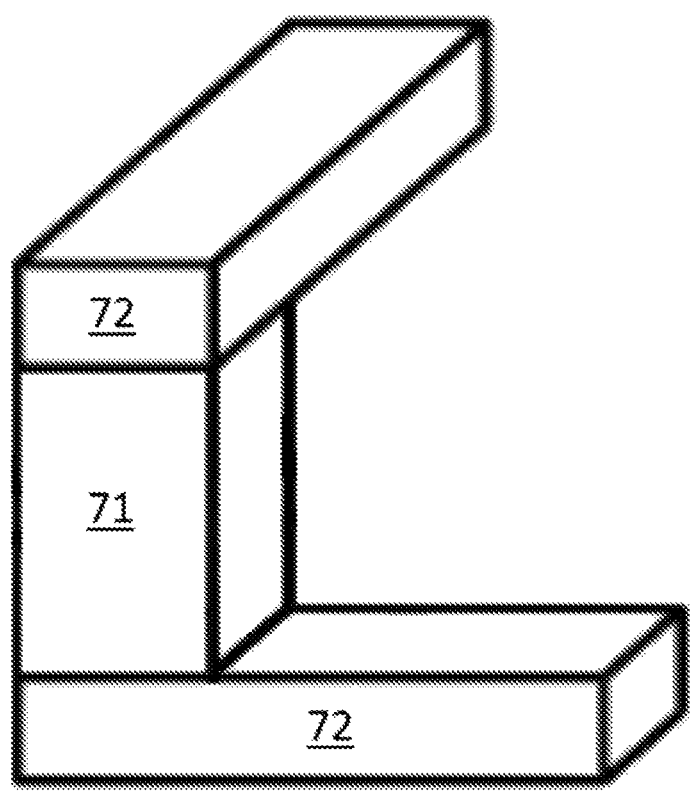
FIG. 12 is a cross-sectional/schematic drawing of a memristor connected to a sense amplifier, according to an embodiment of the present invention.

As show in FIG. 12, forming a memristor with a thin film of titanium dioxide 71 (50 nm) between two 5 nm thick electrodes 72, one platinum and the other titanium, has been contemplated as the device most representative of displaying memristive characteristics: namely, a doped layer and depleted layer contributing to resistance as a result of charge passage through the memristor sufficient to prevent ion movement therethrough. Practical memristors have been reported with 1 ns (1 GHz) switching times.

The invention has been described herein using specific embodiments for the purposes of illustration only. For instance, the foregoing may be modified to form one or more gate arrays. It will be readily apparent to one of ordinary skill in the art, however, that the principles of the invention can be embodied in other ways. Therefore, the invention should not be regarded as being limited in scope to the specific embodiments disclosed herein, but instead as being fully commensurate in scope with the following claims.

I claim:

1. A method of implementing Boolean functionality at a logic gate using a single memristor, the single memristor being capable of outputting an output corresponding to an input which determines the Boolean functionality of the gate, the method comprising the steps of:
   a. applying a first voltage, to the input of the single memristor, within a predetermined range of a first memristor Boolean function, said first voltage being stored within the memristor according to a first memristance value;
   b. applying a second voltage to the input of the single memristor; within the predetermined range of the first memristor Boolean function, said second voltage causing the first memristance value to change to a second memristance value;
   c. reading the output of the single memristor; and
   d. resetting the memristor by applying a third voltage to the input of the single memristor.

2. The method of claim 1 wherein the third voltage is substantially equal to the initial voltage on the logic gate before the application of the first voltage.

3. The method of claim 1 wherein the logic gate implements Boolean logic functionality according to an AND gate.

4. The method of claim 1 wherein the logic gate implements Boolean logic functionality according to an OR gate.

5. The method of claim 1 wherein the logic gate implements Boolean logic functionality according to an NAND gate.

6. The method of claim 1 wherein the logic gate implements Boolean logic functionality according to an NOR gate.

7. The method of claim 1 wherein the input voltage corresponds to a predetermined current according to a hysteresis curve.

* * * * *